United States Patent
Lin et al.

(10) Patent No.: US 6,849,531 B1
(45) Date of Patent: Feb. 1, 2005

(54) PHOSPHORIC ACID FREE PROCESS FOR POLYSILICON GATE DEFINITION

(75) Inventors: Li-Te S. Lin, Hsin-Chu County (TW); Fang-Chen Cheng, Hsin-Chu (TW); Huin-Jer Lin, Hsin-Chu (TW); Yuan-Hung Chiu, Taipei (TW); Hun-Jan Tao, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 10/718,876

(22) Filed: Nov. 21, 2003

(51) Int. Cl.$^7$ .................. H01L 21/4763; H01L 21/302
(52) U.S. Cl. ............... 438/585; 438/719; 438/723; 438/725; 438/756
(58) Field of Search .............. 438/585–592, 438/591, 704, 706, 719, 723, 745, 756, 725

(56) References Cited

U.S. PATENT DOCUMENTS

| | | |
|---|---|---|
| 5,612,249 A | 3/1997 | Sun et al. |
| 6,232,209 B1 * | 5/2001 | Fujiwara et al. ............ 438/585 |
| 6,251,719 B1 | 6/2001 | Wang ......................... 438/238 |
| 6,283,131 B1 | 9/2001 | Chen et al. ................... 134/1.2 |
| 6,403,432 B1 | 6/2002 | Yu et al. ...................... 438/296 |
| 6,524,938 B1 | 2/2003 | Tao et al. .................... 438/585 |
| 6,531,350 B2 | 3/2003 | Satoh et al. ................. 438/197 |
| 6,579,809 B1 | 6/2003 | Yang et al. .................. 438/734 |
| 6,664,604 B1 * | 12/2003 | Besser et al. ............... 257/412 |
| 6,693,313 B2 * | 2/2004 | Gonzalez et al. ........... 257/202 |
| 6,764,903 B1 * | 7/2004 | Chan et al. .................. 438/257 |

* cited by examiner

Primary Examiner—Thanh Nguyen
(74) Attorney, Agent, or Firm—Haynes and Boone, LLP

(57) ABSTRACT

A method of defining a gate structure for a MOSFET device featuring the employment of dual anti-reflective coating (ARC) layers to enhance gate structure resolution, and featuring a dry procedure for removal of all ARC layers avoiding the use of hot phosphoric acid, has been developed. After formation of a polysilicon layer on an underlying silicon dioxide gate insulator layer, a capping silicon oxide, a dielectric ARC layer, and an overlying organic ARC layer are deposited. A photoresist shape is formed and used as an etch mask to allow a first anisotropic RIE procedure to define the desired gate structure shape in the dual ARC layers and in the capping silicon oxide layer. After removal of the photoresist shape and the overlying organic ARC layer a second anisotropic RIE procedure is used to define a desired polysilicon gate structure, with the second anisotropic RIE procedure also resulting in the removal of the dielectric ARC shape. A final hydrofluoric acid type solution is then used to remove the capping silicon oxide shape as well as to remove the portions of the silicon dioxide gate insulator layer not covered by the polysilicon gate structure.

27 Claims, 3 Drawing Sheets

PHOSPHORIC ACID FREE PROCESS FOR POLYSILICON GATE DEFINITION

BACKGROUND OF THE INVENTION (1) Field of the Invention

The present invention relates to methods used to fabricate semiconductor devices, and more specifically to a method used to define a polysilicon gate structure for a metal oxide semiconductor field effect transistor (MOSFET) device.

(2) Description of Prior Art

Micro-miniaturization, or the ability to fabricate semiconductor devices with sub-micron features, has allowed the performance of the sub-micron device to be increased while the fabrication cost of the same sub-micron semiconductor device has been decreased. The smaller device features result in decreases in performance degrading parasitic capacitances in addition to allowing a greater number of smaller semiconductor chips, still comprised with device densities comparable to larger semiconductor chips, to be obtained from a specific size starting wafer thus reducing the process cost of each individual semiconductor chip. One critical dimension of sub micron semiconductor or MOSFET devices, is the width of the conductive gate structure, or the channel length of the MOSFET device. This dimension is critical in determining MOSFET device performance. Conductive gate structures defined in polysilicon layers via photoresist masking and dry etching procedures, have been used to define narrow width conductive gate structures. However to control this critical dimension anti-reflective coatings (ARC), layers are employed underlying the masking photoresist shape to optimize photoresist exposure and thus optimize the definition of the polysilicon gate structure using the narrow photoresist shape as an etch mask. To further insure critical dimension control of the masking photoresist shape a dual ARC strategy is used. The dual ARC technology comprises a bottom anti-reflective coating (BARC), layer underlying the pre-exposed photoresist layer and a dielectric anti-reflective coating (DARC), layer underlying the BARC layer, with the DARC layer sometimes comprised of silicon nitride or silicon oxynitride. After definition of the conductive gate structure removal of the DARC layer is accomplished using a hot phosphoric acid solution capitalizing on the high selectivity between the fast etching silicon nitride or silicon oxynitride DARC layer and underlying non-silicon oxide materials. However the hot phosphoric wet etch tanks if not frequently maintained can be loaded with unwanted particles as a result of previous applications. After DARC removal particles from the contaminated hot phosphoric acid wet etch tank can deposit on critical regions of the in-process MOSFET device resulting in yield loss.

The present invention will describe a procedure for defining a MOSFET device conductive gate structure, wherein a dual ARC technology is used. However this invention will teach removal of a DARC layer without employment of hot phosphoric acid thus avoiding the contamination and possible yield detractors resulting from unwanted particles in the hot phosphoric acid. Prior art such as Yang et al in U.S. Pat. No. 6,579,809 B1, Yu et al in U.S. Pat. No. 6,403,432 B1, and Tao et al in U.S. Pat. No. 6,524,938 B1, describe process sequences in which ARC or BARC layers are employed in defining polysilicon gate structures for MOSFET devices, however the above prior art do not describe the process sequence described in the present invention in which a dual ARC layer is used for critical dimension control and wherein a non-phosphoric acid procedure is used to remove dual ARC components.

SUMMARY OF THE INVENTION

It is an object of this invention to define a conductive gate structure such as a polysilicon gate structure, for a MOSFET device.

It is another object of this invention to employ a photolithographic procedure featuring a dual anti-reflective coating (ARC), to improve the control of the critical dimension, a narrow width polysilicon gate structure, obtained via dry etching procedures.

It is still another object of this invention to remove dual ARC layers comprised of an underlying dielectric ARC (DARC) layer and an overlying organic bottom ARC (BARC) layer, without the use of hot phosphoric acid, preventing particle contamination of the in-process MOSFET device sometimes encountered in hot phosphoric acid baths.

In accordance with the present invention a method of defining a MOSFET polysilicon gate structure wherein a dual ARC coating, employed to enhance dimension control of the polysilicon gate structure, is removed without the use of hot phosphoric acid. After deposition of a polysilicon layer on an underlying gate insulator layer a capping silicon oxide layer is formed on the underlying polysilicon layer. Formation of the dual ARC coating comprised of an underlying DARC layer and an overlying BARC layer, is next accomplished on the underlying silicon oxide layer. A photoresist shape is formed and used an etch mask to define the desired gate structure only in the dual ARC layers and in the capping silicon oxide layer. Removal of the photoresist shape also results in removal of the organic BARC layer, leaving the desired gate conductive shape in the dielectric DARC layer and in the underlying capping silicon oxide layer, overlying the blanket polysilicon layer. A selective, anisotropic reactive ion etching (RIE) procedure is employed to define the desired shape in the polysilicon layer with the selective RIE procedure first removing the DARC layer then using the capping silicon oxide shape as the etch mask. The selective polysilicon RIE procedure terminates at the appearance of the top surface of the gate insulator layer. A hydrofluoric acid dip is used to remove the capping silicon oxide shape as well as removing the portions of gate insulator layer not covered by the now defined polysilicon gate structure.

BRIEF DESCRIPTION OF THE DRAWINGS

The object and other advantages of this invention are best described in the preferred embodiments with reference to the attached drawings that include.

DESCRIPTION OF THE PREFERRED EMBODIMENTS

Figure 1:
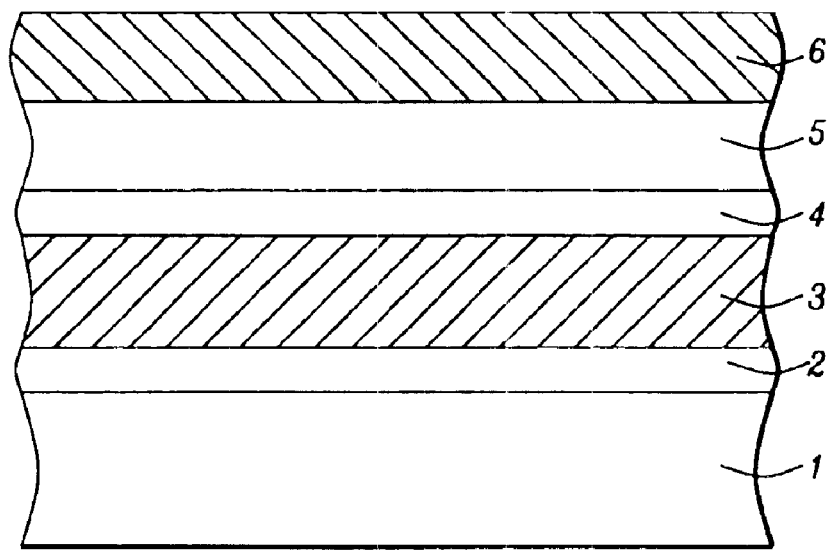
FIGS. 1–6, which schematically in cross-sectional style, describe key stages used to define a MOSFET polysilicon gate structure wherein a dual ARC coating, used to enhance dimension control of the polysilicon gate structure, is removed without the use of hot phosphoric acid.

The method of defining a polysilicon gate structure for a MOSFET device wherein a dual ARC coating is employed as a component of the defining photolithographic procedure, and wherein the dual ARC coating is removed without the use of hot phosphoric acid, will now be described in detail. Semiconductor substrate 1, comprised if P type single crystalline silicon featuring a <100> crystallographic orientation, is used and schematically shown in FIG. 1. Gate insulator 2, comprised of a gate dielectric layer such as thermally grown silicon oxide, silicon oxynitride, nitrogen doped silicon oxide or a high dielectric constant (high k) layer, is formed to a thickness between about 6 to 80 Angstroms on semiconductor substrate 1. The silicon dioxide or nitrogen doped silicon oxide gate dielectric candidates are formed at a thickness between about 6 to 20 Angstroms, while silicon oxynitride or other high k gate dielectric alternatives are formed to a thickness between about 20 to 80 Angstroms. Conductive layer 3, a layer such as polysilicon, is next formed to a thickness between about 400 to 1800 Angstroms. The polysilicon layer can be in situ doped during deposition via the addition of arsine, or phosphine to a silane or disilane ambient, or the polysilicon layer can be deposited intrinsically then implanted with arsenic or phosphorous ions. If desired a metal silicide layer such as tungsten silicide, cobalt silicide, or nickel silicide, can be used as conductive layer 3. Silicon oxide layer 4, is next formed, to be used as a capping oxide layer for the subsequent polysilicon gate definition procedure. Capping silicon oxide layer 4, is obtained at a thickness between about 100 to 400 Angstroms via LPCVD or via plasma enhanced chemical vapor deposition (PECVD) procedures. To improve the ability to define the critical dimension in polysilicon needed for gate width control, anti-coating reflective (ARC), layers can be included as underlying or overlying component layers in a photoresist stack. The ARC layers minimize unwanted spreading phenomena that can occur during photoresist exposure procedures thus increasing the ability to obtain sharper images of the photoresist stack used as the mask for the polysilicon gate structure definition. Organic, bottom ARC (BARC) layers have been used to accomplish this objective, however to further optimize the critical polysilicon width dimension dual ARC coatings comprised of both an underlying dielectric ARC (DARC) layer and the overlying organic BARC layer can also be used as components of the photolithographic procedure. The DARC layer can be a silicon oxynitride (SiON) layer or a silicon nitride layer. Dielectric layer 5, employed in this current invention is a SiON layer obtained at a thickness between about 200 to 600 Angstroms, via PECVD procedures. Organic bottom anti-reflective coating (BARC) layer 6, is next applied at a thickness between about 500 to 1200 Angstroms. The result of these depositions and applications are schematically shown in FIG. 1.

Figure 2:
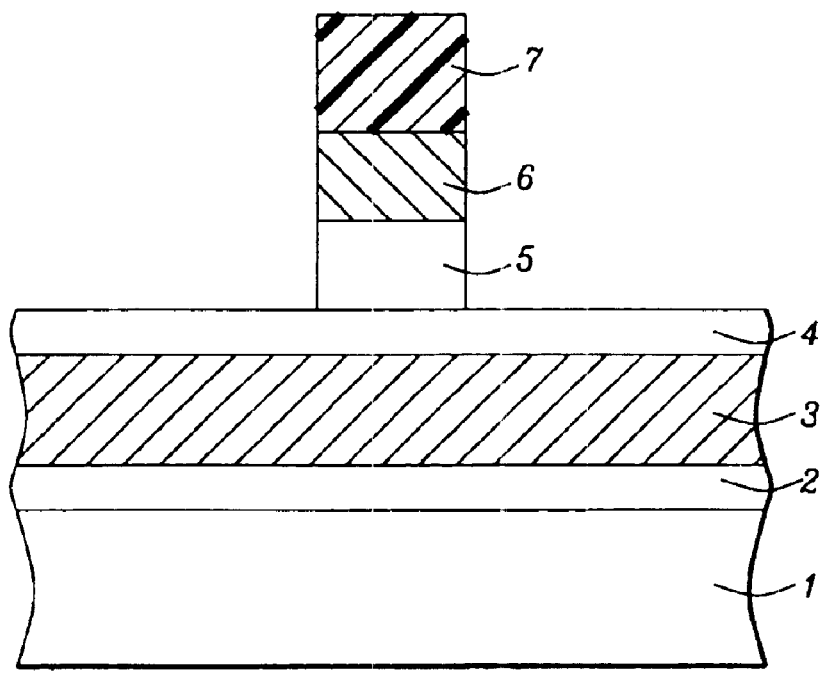

Photoresist shape 7, is next formed via application of a photoresist layer, exposure of the photoresist layer and development or removal of exposed regions of the photoresist layer via alkaline developer solutions. The presence of the dual ARC layers, organic BARC layer 6, and DARC layer 5, reduced unwanted scatter during the exposure cycle resulting in a desired image of photoresist shape 7, between about 1500 to 4000 Angstroms, after the development cycle. The exposed portions of BARC layer 6, are next removed via an anisotropic dry etching procedure such as a RIE procedure, using a chemistry comprised with either $CF_4$, HBR, $O_2$, $CHF_3$, or $CH_2F_2$ as an etchant for organic BARC layer 6. The anisotropic RIE procedure is continued to remove or trim exposed portions of DARC layer 5, using a fluorine based chemistry such as $CHF_3$, $CF_4$, $CH_3F$, or $CH_2F_2$ as an etchant, resulting in a stack comprised of photoresist shape 7, organic BARC shape 6, and dielectric DARC shape 5, overlying capping silicon oxide layer 4. This is schematically shown in FIG. 2.

Figure 3:
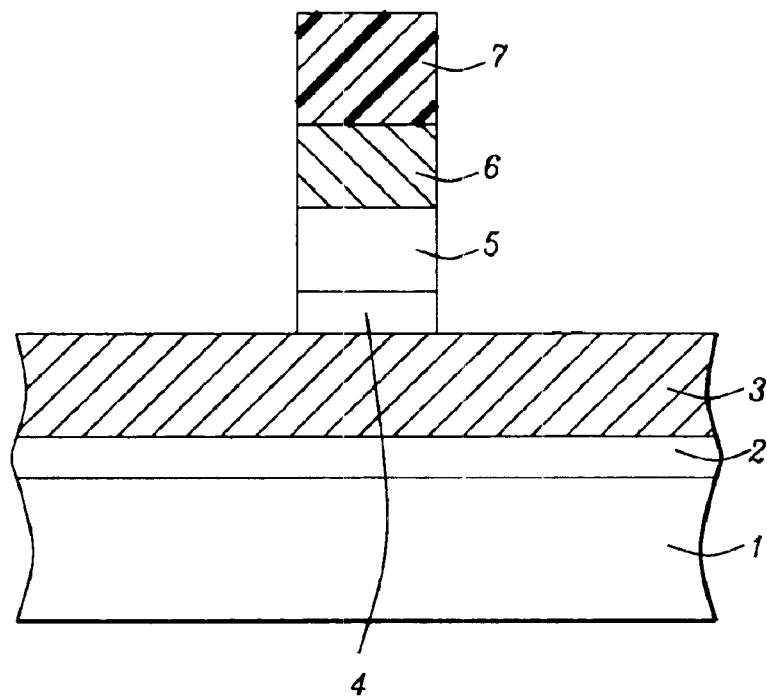

Trimming of silicon oxide layer capping layer 4, is next addressed via continuation of the anisotropic RIE procedure, again using either $CHF_3$, $CF_4$, $CH_3F$, or $CH_2F_2$ as a selective etchant for silicon oxide, using photoresist shape as the etch mask. This is shown schematically in FIG. 3.

Figure 4:
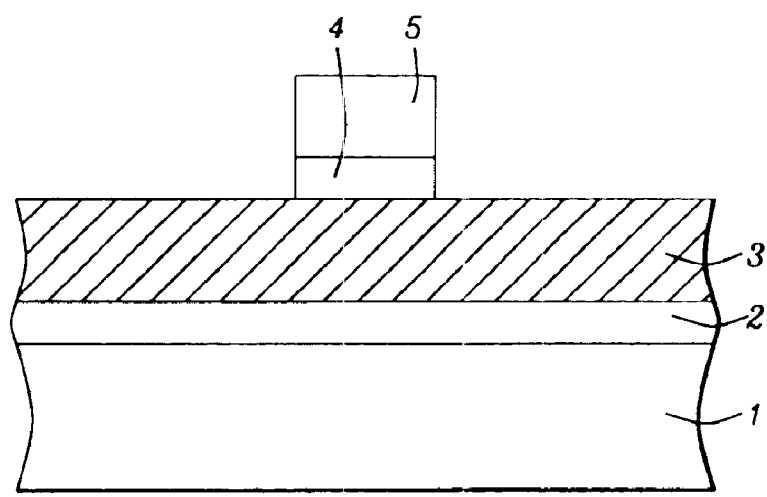

Transfer of the critical dimension in photoresist shape 7, to underlying DARC layer 5, allows removal of photoresist shape to now be performed. This is accomplished via plasma oxygen ashing and follow-up wet strip procedures for removal of photoresist shape 7. The process used to remove photoresist shape 7, also results in removal of organic BARC layer 6, resulting in an etch mask stack now comprised of DARC shape 5, and underlying silicon oxide capping shape 4, on blanket polysilicon layer 3. The result of the photoresist and organic BARC removal procedure is schematically displayed in FIG. 4. The present stack, comprised with the identical critical dimension previously defined in photoresist layer 7, will be used as an etch mask to pattern or define the desired narrow width, MOSFET polysilicon gate structure.

Figure 5:
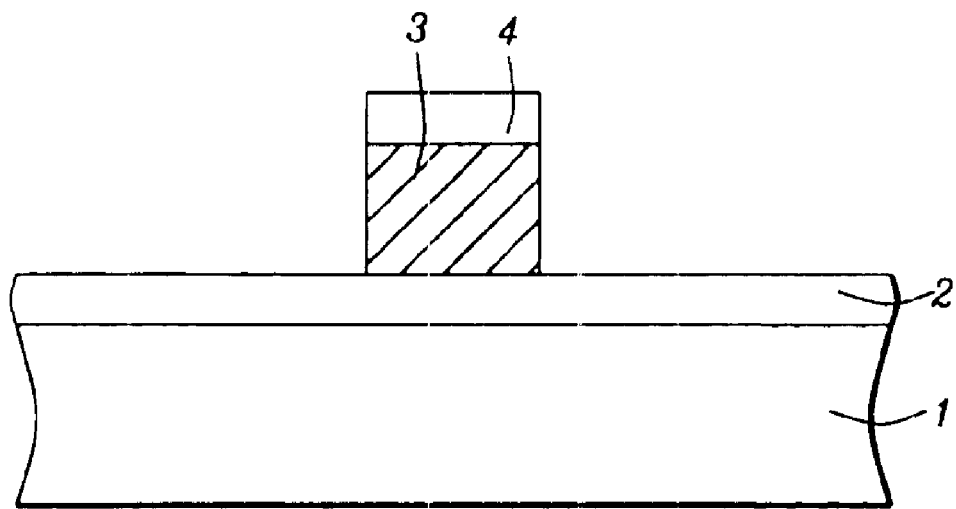

Another anisotropic RIE procedure using a chemistry comprised of $Cl_2$, $CF_4$, HBr, and $O_2$ as etchants for polysilicon layer 3, is next performed resulting in polysilicon gate structure 3. The anisotropic RIE procedure also resulted in the removal of dielectric DARC shape 5, with the selectivity, or the high etch rate ratio of DARC or polysilicon to silicon oxide, allowing the RIE procedure to terminate at the appearance of the top surface of silicon dioxide gate insulator layer 2, as well as terminating at the appearance of capping silicon oxide shape 4, allowing capping silicon oxide shape 4, to perform as an etch mask to transfer the critical dimension in the polysilicon layer. This is schematically shown in FIG. 5. Of great importance is the employment of a dry etch procedure for removal of DARC shape 5, avoiding the use of a hot phosphoric acid for DARC removal. The cleaner dry etch procedure avoids the particles encountered in hot phosphoric acid procedures and thus eliminates possible MOSFET yield loss resulting from particle contamination.

Figure 6:
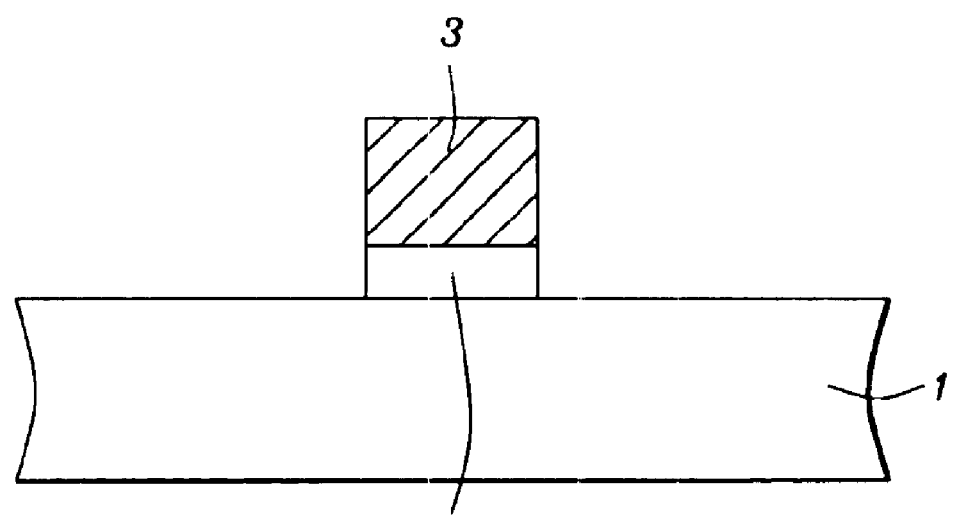

A hydrofluoric acid type procedure, either a dilute hydrofluoric (DHF), or a buffered hydrofluoric (BHF), wet procedure, is then applied to remove portions of silicon dioxide gate insulator layer not covered by polysilicon gate structure 3. Capping silicon oxide shape 4, is also selectively removed during this procedure resulting in polysilicon gate structure 3, on underlying silicon dioxide gate insulator layer 2, with the desired critical dimension for the polysilicon gate structure successfully transferred via use of a dielectric DARC layer, and with the DARC layer removed via an integrated transfer procedure accomplished without the use of a contaminating hot phosphoric acid bath. This is schematically shown in FIG. 6

Other iterations of this invention feature definition of a stack comprised of photoresist shape 7, BARC shape 6, DARC shape 5, followed by an oxygen ashing procedure removing both photoresist shape 7, and organic BARC shape 6, leaving DARC shape 5, as an etch mask for anisotropic etching or trimming of capping silicon oxide layer 4. The definition of polysilicon gate structure 3, is again accomplished via dry etching procedures wherein DARC shape 5, is again removed during the dry etch procedure, again avoiding the use of hot phosphoric acid.

While this invention has been particularly shown and described with reference to the preferred embodiments thereof, it will be understood by those skilled in the art that various changes in form and details may be made without departing from the spirit and scope of this invention.

What is claimed is:

1. A method of defining a conductive gate structure for a metal oxide semiconductor field effect transistor (MOSFET) device on a semiconductor substrate, comprising the steps of:

providing a gate insulator layer on said semiconductor substrate;

forming a conductive layer on said gate insulator layer;

forming a capping insulator layer on said conductive layer, forming a dielectric anti-reflective coating (DARC) layer on said capping insulator layer;

forming a patterned photoresist shape on said DARC layer;

performing a first phase of a first dry etch procedure using said photoresist shape as an etch mask to define a first stack comprised of said photoresist shape and a DARC shape;

performing a second phase of said first dry etch procedure using said photoresist shape as an etch mask to define a capping insulator shape underlying said first stack;

removing said photoresist shape resulting in a second stack comprised of said DARC shape and said capping insulator shape;

performing a second dry etch procedure using said second stack as an etch mask to define a conductive gate structure and to remove said DARC shape; and performing a wet etch procedure to remove portions of said gate insulator layer not covered by said conductive gate structure and to remove said capping insulator layer.

2. The method of claim 1, wherein said gate insulator layer is a silicon dioxide layer at a thickness between about 6 to 80 Angstroms.

3. The method of claim 1, wherein said conductive layer is a polysilicon layer at a thickness between about 400 to 1800 Angstroms, wherein a polysilicon layer is either doped in situ during deposition via the addition of arsine or phosphine to a silane ambient, or wherein a polysilicon layer is deposited intrinsically then doped via implantation of arsenic or phosphorous ions.

4. The method of claim 1, wherein said conductive layer is a metal silicide layer such as a tungsten silicide layer.

5. The method of claim 1, wherein said capping insulator layer is a silicon oxide layer obtained at a thickness between about 100 to 400 Angstroms via LPCVD or via plasma enhanced chemical vapor deposition (PECVD) procedures.

6. The method of claim 1, wherein said DARC layer is a silicon oxynitride (SiON) layer obtained at a thickness between about 200 to 600 Angstroms, via PECVD procedures.

7. The method of claim 1, wherein said DARC layer is a silicon nitride layer.

8. The method of claim 1, wherein said organic bottom anti-reflective coating (BARC), at a thickness between about 500 to 1200 Angstroms, is formed on said DARC layer.

9. The method of claim 1, wherein said photoresist shape is comprised with a width between about 1500 to 4000 Angstroms.

10. The method of claim 1, wherein said first phase of a first dry etch procedure used to define said first stack comprised of said photoresist shape, a BARC shape, and said DARC shape, is an anisotropic reactive ion etch (RIE) procedure performed using $CF_4$, $CHF_3$, $CH_2F_2$, HBR, $O_2$ and $N_2$ as etchants.

11. The method of claim 1, wherein said second phase of said first dry etch procedure used to define said capping insulator shape, is anisotropic reactive ion etch (RIE) procedure performed using a fluorine based chemistry comprised with either $CHF_3$, $CH_3F$, $CH_2F_2$, or $CF_4$ as an etchant.

12. The method of claim 1, wherein said photoresist shape and a BARC shape are removed via plasma oxygen ashing procedures.

13. The method of claim 1, wherein said second dry etch procedure used to define said conductive gate structure and to remove said DARC shape, is an anisotropic RIE procedure using an etch chemistry comprised of $Cl_2$, HBR, and $CF_4$ as etchants.

14. The method of claim 1, wherein said wet etch procedure used to remove portions of said gate insulator layer not covered by said conductive gate structure and to remove said capping insulator shape, is performed using either a dilute hydrofluoric (DHF) or a buffered hydrofluoric (BHF) acid solution.

15. A method of defining a polysilicon gate structure for a (MOSFET) device on a semiconductor substrate using dual anti-reflective coating (ARC) layers, and featuring dry etch removal of a dielectric ARC component, comprising the steps of:

providing a silicon dioxide gate insulator layer on said semiconductor substrate;

forming a polysilicon layer on said silicon dioxide gate insulator layer;

forming a capping silicon oxide layer on said polysilicon layer;

forming a dielectric anti-reflective coating (DARC) layer on said capping silicon oxide layer; forming an organic bottom anti-reflective coating (BARC) layer on said DARC layer;

forming a photoresist shape on said BARC layer;

performing a first phase of a first anisotropic reactive ion etching (RIE) procedure using said photoresist shape as an etch mask, to define a first stack comprised of said photoresist shape, a BARC shape, and a DARC shape;

performing a second phase of said first anisotropic RIE procedure using said photoresist shape as an etch mask, to define a capping silicon oxide shape underlying said first stack;

removing said photoresist shape and said BARC shape resulting in a second stack comprised of said DARC shape and said capping silicon oxide shape;

performing a second anisotropic RIE procedure using said second stack as an etch mask to define said polysilicon gate structure and to remove said DARC shape; and performing a wet etch procedure to remove portions of said silicon dioxide gate insulator layer not covered by said polysilicon gate structure, and to remove said capping silicon oxide layer.

16. The method of claim 15, wherein said silicon dioxide gate insulator layer is obtained at a thickness between about 6 to 80 Angstroms.

17. The method of claim 15, wherein said polysilicon layer is obtained at a thickness between about 400 to 1800 Angstroms, wherein a polysilicon layer is either doped in situ during deposition via the addition of arsine or phosphine to a silane ambient, or deposited intrinsically then doped via implantation of arsenic or phosphorous ions.

18. The method of claim 15, wherein said capping silicon oxide layer is obtained at a thickness between about 100 to 400 Angstroms via LPCVD or via plasma enhanced chemical vapor deposition (PECVD) procedures.

19. The method of claim 15, wherein said DARC layer is a silicon oxynitride (SiON) layer obtained at a thickness between about 200 to 600 Angstroms, via PECVD procedures.

20. The method of claim 15, wherein said DARC layer is a silicon nitride layer.

21. The method of claim 15, wherein said BARC layer is applied at a thickness between about 500 to 1200 Angstroms.

22. The method of claim 15, wherein said photoresist shape is comprised with a width between about 1500 to 4000 Angstroms.

23. The method of claim 15, wherein said first phase of said first anisotropic RIE procedure used to define said first stack comprised of said photoresist shape, said BARC shape, and said DARC shape, is performed using a chemistry comprised with $CF_4$, $CH_{F3}$, $CH_2F_2$, HBR, $O_2$ and $N_2$ as etchants.

24. The method of claim 15, wherein said second phase of said first anisotropic RIE procedure used to define said capping insulator shape, is performed using a fluorine based chemistry comprised with either $CHF_3$, $CF_4$, $CH_2F_2$, and $CH_3F$ as etchants.

25. The method of claim 15, wherein said photoresist shape and BARC shape are removed via plasma oxygen ashing procedures.

26. The method of claim 15, wherein said second anisotropic RIE procedure, used to define said conductive gate structure and to remove said DARC shape, is performed using $Cl_2$, HBR, and $CF_4$ as etchants.

27. The method of claim 15, wherein said wet etch procedure used to remove portions of said silicon dioxide gate insulator layer not covered by said polysilicon gate structure, and to remove said capping silicon oxide shape, is performed using either a dilute hydrofluoric (DHF) or a buffered hydrofluoric (BHF) acid solution.

* * * * *